US008416108B2

(12) United States Patent
Nakada (10) Patent No.: US 8,416,108 B2
(45) Date of Patent: Apr. 9, 2013

(54) ANALOG-TO-DIGITAL CONVERSION APPARATUS, ANALOG-TO-DIGITAL CONVERSION METHOD, AND ELECTRONIC DEVICE

(75) Inventor: Masato Nakada, Fujimi (JP)

(73) Assignee: Tanita Corporation, Tokyo (JP)

( * ) Notice: Subject to any disclaimer, the term of this patent is extended or adjusted under 35 U.S.C. 154(b) by 97 days.

(21) Appl. No.: 13/161,994

(22) Filed: Jun. 16, 2011

(65) Prior Publication Data

US 2012/0007761 A1  Jan. 12, 2012

(30) Foreign Application Priority Data

Jul. 7, 2010  (JP) ................................. 2010-154623

(51) Int. Cl.
*H03M 1/20* (2006.01)
(52) U.S. Cl.
USPC .......................................... 341/131; 341/155
(58) Field of Classification Search .................. 341/155, 341/162, 131, 138, 139
See application file for complete search history.

(56) References Cited

U.S. PATENT DOCUMENTS

| 4,851,842 | A | * | 7/1989 | Iwamatsu ...................... 341/139 |
| 5,552,783 | A | * | 9/1996 | Kommrusch ................. 341/118 |
| 5,825,318 | A | * | 10/1998 | Patapoutian et al. ......... 341/131 |
| 6,507,449 | B1 | | 1/2003 | Sutardja |
| 7,075,466 | B1 | * | 7/2006 | Woodall et al. ............... 341/131 |
| 7,493,052 | B2 | * | 2/2009 | Blake et al. ................... 398/208 |
| 8,289,198 | B2 | * | 10/2012 | Agarwal et al. ............... 341/172 |
| 2005/0206545 | A1 | | 9/2005 | Kobayashi et al. |

FOREIGN PATENT DOCUMENTS

| JP | 2007-266951 A | 10/2007 |
| JP | 2009-267808 A | 11/2009 |
| JP | 2010-011906 | 1/2010 |

OTHER PUBLICATIONS

Extended European Search Report issued in European Patent Application No. 11168860.2 mailed Nov. 8, 2012.

* cited by examiner

*Primary Examiner* — Peguy Jean Pierre
(74) *Attorney, Agent, or Firm* — McDermott Will & Emery LLP (57) ABSTRACT

An AD conversion apparatus includes a shift signal generating portion configured to generate n shift signals (n is a natural number greater than one) of which amplitudes are different from each other; a shift signal controlling portion configured to control the shift signal generating portion; a compounding portion configured to compound input analog signal and the n shift signals sequentially into n first signals; an AD converting portion configured to execute AD conversion to convert the n first signals into n second signals; and a signal processing portion configured to calculate an average of the n second signals to generate output digital signal.

8 Claims, 7 Drawing Sheets

ANALOG-TO-DIGITAL CONVERSION APPARATUS, ANALOG-TO-DIGITAL CONVERSION METHOD, AND ELECTRONIC DEVICE

BACKGROUND OF THE INVENTION

1. Field of the Invention

The present invention relates to an analog-to-digital (AD) conversion apparatus, an AD conversion method, and an electronic device.

2. Related Art

Sampling methods used in AD converter are classified broadly into a type of executing sampling with Nyquist frequency and an oversampling type of executing sampling with frequency higher than Nyquist frequency. The oversampling type is intended to enhance a resolution even using an AD converter with a low resolution. Σ-Δ (sigma-delta) type sampling is exemplified as one of the common sampling methods at this time.

The oversampling type AD converter obtains an intermediate value of output codes by averaging a plurality of AD conversion results sampled with sampling rate higher than the Nyquist frequency. The intermediate value is obtained with various techniques. The original form to obtain the intermediate value utilizes white noise as dither noise.

The principle to obtain the intermediate value is that the intermediate value of output codes from the AD converter can be obtained by averaging the plurality of the AD conversion results when outputs from the AD converter on each conversion take different values influenced by noise (that is, when outputs keep flickering). This principle has the premise that an average of the noise which causes the flickering is zero, that an effective value of the noise level to the resolution of the AD converter takes from ⅓ LSB (Least Significant Bit) to several LSBs, and that the noise has sufficiently broad bandwidth so that a different result can be obtained on each sampling.

Patent Document 1: JP-A-2010-11906

However, it is often difficult for the AD converter with the low resolution to obtain effects of oversampling since its noise level is far lower than the amplitude of 1 LSB of the AD converter. It is not only technically difficult but also costly to generate white noise with appropriate bandwidth intendedly and stably. Thermal noise of a resistance is widely understood as an example of white noise. The noise voltage $v_n$ is represented as $v_n = (4kTR\Delta f)^{1/2}$ (k: Boltzmann constant, T: temperature, R: resistance, $\Delta f$ bandwidth of noise). Even if R=1 MΩ, T=300 K, and M=1 MHz, the noise voltage to be obtained is 0.13 mVrms at most. When a 10 bit AD converter has an input voltage range from 0 V to 3 V, the resolution of the 10 bit AD converter is approximately 3 mV/LSB. As a result, the thermal noise should be amplified several dozenfold for practical purposes.

The frequency band of white noise should be sufficiently higher than signal frequency. If a negative feedback circuit including an operational amplifier for noise amplification is utilized, high frequency-response property corresponding to gain of the operational amplifier is required. Furthermore, particularly low equivalent input noise of the operational amplifier is required for utilizing thermal noise as white noise for sampling. An operational amplifier which satisfies such requirements is far better performing and expensive than a general buffer amplifier placed before the AD converter for processing an original signal. Moreover, an actual resistive element generates not only theoretical thermal noise but also large 1/f noise, a noise level of the thermal noise may vary depending on temperature, and environmental noise may be superimposed on the thermal noise. Accordingly, it is difficult to generate large amounts of noise intentionally and stably.

Noise of a Zener diode similar to white noise might be adopted as the sampling noise. However, the Zener diode has problems in that it consumes huge amounts of current, its inter-individual difference is large, and its temperature property is worse than that of the resistance.

In another problem, in the oversampling with dither noise, if that is required for improving a resolution of sampling to increase the number of sampling in accordance with the number of bits.

The Σ-Δ type sampling, which is another type of oversampling, shortens measurement time for sampling in comparison with the oversampling with the dither noise, meanwhile the Σ-Δ type sampling requires massive and complex digital processing. The Σ-Δ type sampling prevails due to current miniaturization technologies. However, semiconductor products specialized for the Σ-Δ type sampling remain expensive. If the digital processing to be executed by hardware in the semiconductor products is executed by software, only a signal having a frequency lower than one several dozenth of clock frequency can be processable. Therefore, it is difficult to execute the Σ-Δ type sampling at high frequency.

SUMMARY OF THE INVENTION

Accordingly, the present invention provides an AD conversion apparatus and an AD conversion method that enables precision AD conversion with simplified composition.

In accordance with an aspect of the present invention, an AD conversion apparatus includes: a shift signal generating portion configured to generate n shift signals (n is a natural number greater than one) of which amplitudes are different from each other; a compounding portion configured to compound input analog signal and the n shift signals sequentially into n first signals; an AD converting portion configured to execute AD conversion to convert the n first signals into n second signals; and a signal processing portion configured to process the n second signals into output digital signal, in which the shift signal generating portion is configured to generate the n shift signals so that each difference between adjacent shift signals differs from natural number multiples of a minimum resolution of the AD converting portion when the n shift signals are arranged according to the amplitudes.

In this embodiment, since the first signals are generated by compounding the n shift signals and input analog signal, depending on the amplitudes of the shift signals, some results may exceed the minimum resolution and others may be under the minimum resolution. The n second signals include more precision information than the minimum resolution. As a result, the resolution of AD conversion can be improved by generating the output digital signal based on the second signals. In particular, since each difference between adjacent shift signals is set to differ from natural number multiples of a minimum resolution of the AD converting portion when the n shift signals are arranged according to the amplitudes, the resolution can be improved efficiently.

In this application, the word 'compounding' includes not only 'addition' but also 'subtraction'.

Preferably, the shift signal generating portion may be configured to generate the n shift signals so that the differences between the adjacent shift signals are equal to each other and so that the differences are less than the minimum resolution when the n shift signals are arranged according to the amplitudes. In this situation, the n shift signals are separated equivalently from each other, and each of the differences is less than the minimum resolution. As a result, the resolution of AD conversion can be improved by compounding such shift signals and the input analog signal.

More preferably, the shift signal generating portion may be configured to generate the n shift signals so that a difference between a minimum value and a maximum value of the n shift signals is equal to or greater than the minimum resolution of the AD converting portion. In this situation, given any amplitude of the input signal, at least one of the n first signals exceeds the minimum resolution so that at least one of the n second signals takes a different value from the other second signals. As a result, the resolution of the AD conversion can be further improved.

Preferably, the signal processing portion may be configured to calculate an average of the n second signals to generate the output digital signals.

Preferably, the input analog signal may be an alternating-current signal which repeats at a constant interval, one cycle of the alternating-current may correspond to the interval, the AD converting portion may execute AD conversion in synchronization with the alternating-current signal, the AD conversion apparatus may further include a shift signal controlling portion configured to control the shift signal generating portion so as to switch the n shift signals every interval of the alternating-current signal, and the signal processing portion may process the n second signals in each same phase of each interval of the alternating-current signal into the output digital signal.

When the alternating-current signal which repeats at the constant interval is AD-converted on a plurality of phase points per one interval (cycle) in synchronization with the cycle, the compounding of n shift signals and the alternating-current signal should be done on the same phase point of the alternating-current signal. In this embodiment, the number of switching can be reduced by switching the shift signals every interval of the alternating-current signal.

Preferably, the input analog signal may be an alternating-current signal which repeats at a constant interval, one cycle of the alternating-current may correspond to the interval, the AD conversion apparatus may be configured to generate the output digital signal based on the n·p intervals (p is a natural number greater than one) of the alternating-current signal, the AD converting portion may execute AD conversion in synchronization with the alternating-current signal, the AD conversion apparatus may further include a shift signal controlling portion configured to control the shift signal generating portion so as to switch the n shift signals every p intervals of the alternating-current signal, and the signal processing portion may process the n·p second signals in each same phase of each interval of the alternating-current signal into the output digital signal.

In this embodiment, the number of switchings can be greatly reduced by switching the shift signals every p intervals. As a result, time required for AD conversion can be greatly shortened.

The present invention can certainly be understood as an AD conversion method. In accordance with an aspect of the present invention, an AD conversion method includes: generating n shift signals (n is a natural number greater than one) of which amplitudes are different from each other; compounding input analog signal and the n shift signals sequentially into n first signals; executing AD conversion to convert the n first signals into n second signals; and processing the n second signals into an output digital signal, in which each difference between adjacent shift signals differs from natural number multiples of a minimum resolution of the AD conversion when the n shift signals are arranged according to the amplitudes.

BRIEF DESCRIPTION OF THE DRAWINGS

With reference to the accompanying drawings, embodiments according to the present invention will be described hereinafter. In the drawings.

DETAILED DESCRIPTION OF PREFERRED EMBODIMENTS

First Embodiment

Figure 1:
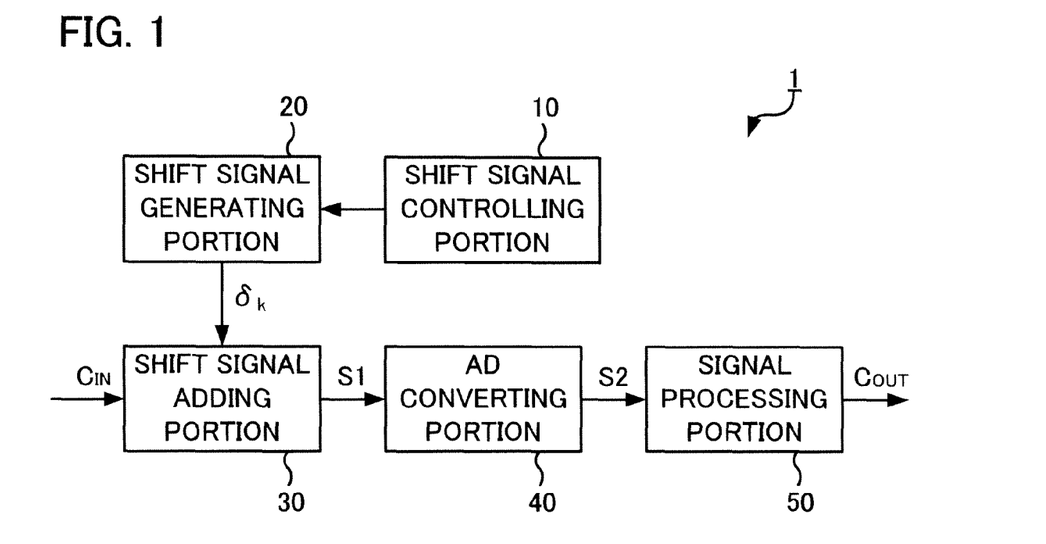
FIG. 1 is a block diagram which shows an AD conversion apparatus according to the first embodiment of the present invention.

FIG. 1 is a block diagram which shows AD conversion apparatus 1 according to an embodiment of the present invention. Input analog signal $C_{in}$ is supplied to AD conversion apparatus 1. AD conversion apparatus 1 outputs output digital signals $C_{out}$. AD conversion apparatus 1 includes shift signal generating portion 20 and shift signal controlling portion 10. Shift signal generating portion 20 generates n (n is a natural number greater than one) shift signals $\delta_k$ (k is an integer from 0 to n−1). Shift signal controlling portion 10 controls shift signal generating portion 20 to switch n shift signals $\delta_k$ in accordance with a predetermined rule.

AD conversion apparatus 1 further includes shift signal adding portion 30, AD converting portion 40, and signal processing portion 50. Signal adding portion 30 generates n first signals S1 by adding each of n shift signals $\delta_k$ to input analog signal $C_{in}$. AD converting portion 40 executes AD conversion to convert n first signals S1 into n second signals S2. Signal processing portion 50 processes n second signals S2 into output digital signals $C_{out}$.

AD converting portion 40 may generate 10 bit second signals S2. Each of first signals S1 is quantized. That is, each of first signals S1 is compared with discrete values in which a full scale range (FSR) is equally divided by $2^{10}$ to be approximated to the closest discrete value. $FSR/2^{10}$ (=1 LSB) is a minimum resolution (synonymous to a quantization resolution). An amplitude of first signal S1 being less than 1 LSB is not possible to be detected and becomes a quantization error. The smaller the minimum resolution is, the higher the accuracy of AD conversion and the cost of the AD converter are. In this embodiment, the minimum resolution can be substantially improved by using shift signals $\delta_k$.

The amplitudes of n shift signals $\delta_k$ are different from each other. Each of the amplitudes is selected so that each difference between adjacent shift signals $\delta_k$ differs from natural number multiples of the minimum resolution (1 LSB) when n shift signals $\delta_k$ are arranged according to the amplitudes. In this embodiment, each of the amplitudes is set so that the differences between adjacent shift signals $\delta_k$ are equal to each other and so that the differences are less than the minimum resolution when n shift signals $\delta_k$ are arranged according to the amplitudes. "The differences between adjacent shift signals $\delta_k$ are equal to each other" means where n shift signals $\delta_k$ are arranged such that $\delta_{n-1}-\delta_{n-2}=\delta_{n-2}-\delta_{n-3}=\ldots=\delta_2-\delta_1=\delta_1-\delta_0$ when $\delta_0, \delta_1, \ldots, \delta_{n-2}$, and $\delta_{n-1}$ are arranged in ascending order.

Input analog signal $C_{in}$ plus shift signal $\delta_k$ makes first signal 51. It is assumed that input analog signal $C_{in}$ is less than the minimum resolution of AD converting portion 40 in a following example. When input analog signal $C_{in}$ is directly supplied to AD converting portion 40, second signal S2 takes the value of zero. On the other hand, first signal S1 to which shift signal $\delta_k$ has been added may occasionally exceed the minimum resolution depending on the amplitudes of input analog signal $C_{in}$ and shift signal $\delta_k$. When most of n first signals S1 to each of which each of n shift signals $\delta_k$ has been added exceed the minimum resolution and thus most of second signals S2 take the value of one, input analog signal $C_{in}$ should be close to the minimum resolution. When most of n first signals S1 do not exceed the minimum resolution and thus most of second signals S2 take the value of zero, input analog signal $C_{in}$ should be far from the minimum resolution and should be small. That is, the amplitude of input analog signal $C_{in}$ can be calculated in accordance with the number of n second signals S2 which take the value of one.

Signal processing portion 50 calculates an average of n second signals S2 to generate output digital signal $C_{out}$. As a result, output digital signals $C_{out}$ to which the discrete values are less than the minimum resolution of AD converting portion 40 have been assigned can be outputted.

Figure 2:
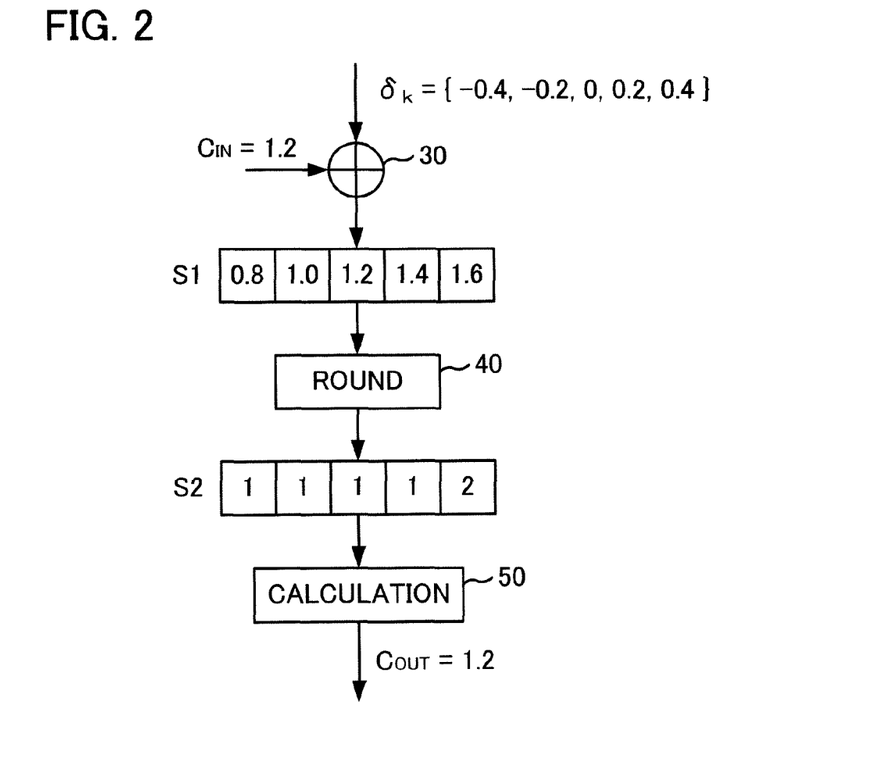
FIG. 2 shows an outline of an AD conversion operation.

Operations of AD conversion apparatus 1 will be explained with reference to FIG. 2. In a following example, n is five and five shift signals $\delta_k$ are supplied from shift signal generating portion 20.

The operation of AD converting portion 40 is simplified to be represented as follows:

$$S2 = \text{Round}(S1)$$

A 'Round' is a function which rounds first signal S1 being an analog value to the nearest whole number. For instance, if S1=0.4, S2 takes the value of zero and if S1=0.6, S2 takes the value of one.

Shift signals $\delta_k$ (k=0, ..., n-1) are added to input analog signal $C_{in}$ and they are averaged. The calculation of signal processing portion 50 is represented as follows:

$$C_{out} = 1/n \times \Sigma[\text{Round}(C_{in}+\delta_k)] \ (k=0, \ldots, n-1)$$

When $C_{in}$ is equal to 1.2 and $C_{in}$ is simply supplied to AD converting portion 40, the output code will be rounded as follows:

$$C_{out} = \text{Round}(1.2) = 1.0$$

In other words, the original resolution (fractional portion) of AD converting portion 40 cannot be exceeded without shift signals $\delta_k$.

Given that n=5 and $\delta_k=\{-0.4, -0.2, 0, 0.2, 0.4\}$, first signals S1 are represented as S1=$\{0.8, 1, 1.2, 1.4, 1.6\}$. Second signals S2, which correspond to five first signals S1, are represented as S2=$\{1, 1, 1, 1, 2\}$.

Signal processing portion 50 executes calculation of an average. Output digital signal $C_{out}$ is represented by the following formula:

$$C_{out} = (1+1++1+1+2)/5 = 1.2$$

As described above, a higher resolution (decimal fraction) than the original resolution (integer) of AD converting portion 40 can be obtained by superimposing a plurality of shift signals $\delta_k$ with amplitudes different from the amplitude of the original minimum resolution (1 LSB) of AD converting portion 40 on input analog signal $C_{in}$.

Given that an output digital signal which corresponds to input analog signal $C_{in1}$ is $C_{out1}$ and an output where input analog signal $C_{in1}$ differs by only a minute value $\epsilon$ (that is, an output of $C_{in1}+\epsilon$) is $C_{out2}$, $C_{out1}$ and $C_{out2}$ are represented as follows:

$$C_{out1} = 1/n \times \Sigma[\text{Round}(C_{in1}+\delta_k)]$$

$$C_{out2} = 1/n \times \Sigma[\text{Round}(C_{in1}+\epsilon+\delta_k)]$$

When differences $\Delta$ between adjacent shift signals are equivalent ($\delta_{k+1}-\delta_k=\Delta$), $C_{out2}$ and $C_{out1}$ are different from each other at least if $\epsilon=\Delta$.

$C_{out2}$ can be represented as follows:

$$C_{out2} = 1/n \times \sum [\text{Round}(C_{in1}+\varepsilon+\delta_k)]$$
$$= 1/n \times \sum [\text{Round}(C_{in1}+\delta_{k+1})] (k=0, \ldots, n-1)$$

The worst value of the resolution is represented as follows:

$$C_{out2} - C_{out1} = 1/n \times \sum \{\text{Round}(C_{in1}+\delta_{k+1}) - \text{Round}(C_{in1}+\delta_k)\}$$
$$= 1/n \times \{\text{Round}(C_{in1}+\delta_n) - \text{Round}(C_{in1}+\delta_0)\}$$
$$= 1/n \times \{\text{Round}(C_{in1}+\delta_0+n\Delta) - \text{Round}(C_{in1}+\delta_0)\}$$

The last formula means that the resolution is determined depending on a range where shift signals $\delta_k$ are distributed and the number n of shift signals $\delta_k$. It is preferable for enhancing the resolution that $\Delta$ be set to be small and n be set to be large. In practice, code widths of AD converting portion 40 and step widths of shift signals $\delta_k$ are not uniform and have errors. In view of enhancing precision, it is preferable to adjust $n\Delta$ to several LSBs so that the nonuniformity can be equalized.

Second Embodiment

The second embodiment will be explained using body measurement apparatus 100 as an example of an electronic device that includes above-described AD conversion apparatus 1.

Composition of the Body Measurement Apparatus

Figure 3:
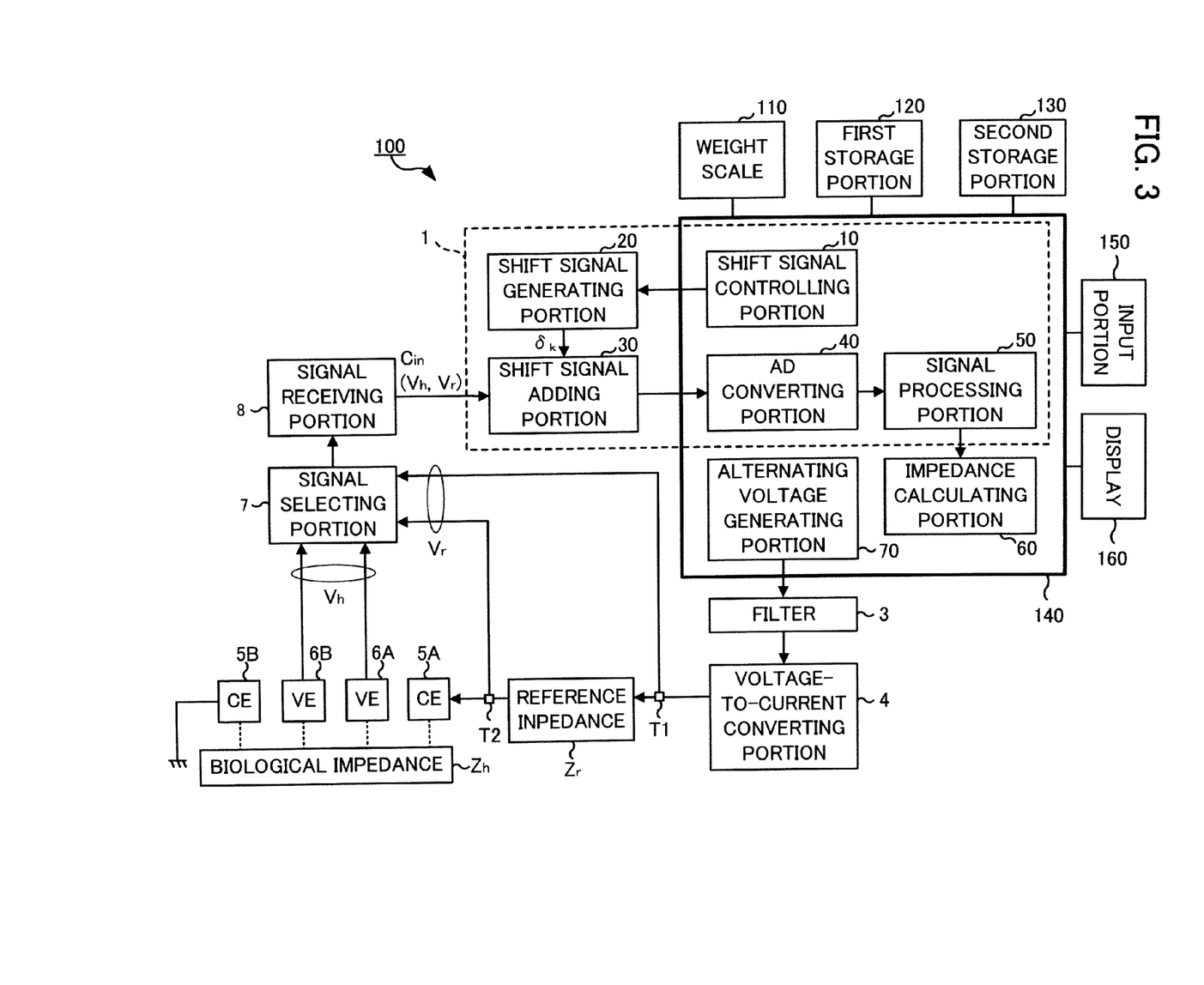
FIG. 3 is a block diagram which shows a body measurement apparatus according to the second embodiment.

FIG. 3 is a block diagram which shows a composition of body measurement apparatus 100 according to an embodiment of the present invention. Body measurement apparatus 100 measures bioelectrical impedance and a weight of a human subject and computes biological information such as a body fat percentage by calculation based on those measured and preliminarily input personal information such as height, sex, and age.

Body measurement apparatus 100 includes weight scale 110, first storage portion 120, second storage portion 130, input portion 150, and display 160. These elements are connected to microcontroller 140 through a bus (not shown). Microcontroller 140 acts as a control center which controls the whole apparatus. Microcontroller 140 works with a clock signal supplied from a clock signal generation circuit (not shown). When a power switch (not shown) is turned on, a power circuit powers each of the elements.

Weight scale 110 measures the weight of the human subject and outputs weight data to microcontroller 140 through the bus. First storage portion 120 is a nonvolatile memory such as ROM (Read Only Memory). Control programs for controlling the whole apparatus are stored in first storage 120. Microcontroller 140 generates the biological information such as the body fat percentage by executing predetermined calculations in accordance with the control programs.

Second storage portion 130 is a volatile memory such as DRAM (Dynamic Random Access Memory). Second storage portion 130 acts as a working area used by microcontroller 140 and stores data when the microcontroller executes the predetermined calculations.

Input portion 150 includes various switches. When the human subject operates the switches, information such as height, age, and sex is input. Display 160 displays measurement results such as weight and body fat percentage and messages promoting the human subject to input various types of information. Display 160 may be made of a liquid crystal display device.

Figure 4:
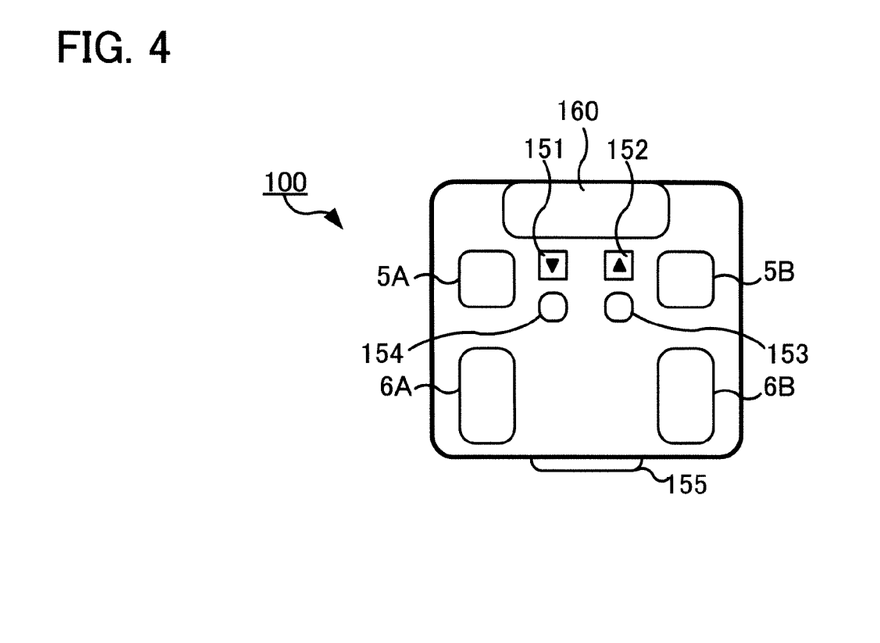
FIG. 4 is a plan view which shows an appearance of the body measurement apparatus.

More concretely, as illustrated in FIG. 4, display 160 is placed on an upper center of a chassis. Input portion 150 includes switches 151 to 155. Switch 151 and 152 may act as up and down switches used for inputting a numerical value or selecting a menu. Switch 153 and 154 may act as a switch for determining an input state. Switch 155 may act as a power switch.

Above-describe AD conversion apparatus 1 is incorporated in body measurement apparatus 100. In this embodiment, AD converting portion 40 is embedded in microcontroller 140. Shift signal controlling portion 10 and signal processing portion 50 are realized by executing the predetermined programs in microcontroller 140. Microcontroller 140 includes impedance calculating portion 60 and alternating voltage signal generating portion 70.

Impedance calculating portion 60 calculates impedance based on output digital signals $C_{out}$ outputted from signal processing portion 50. Alternating voltage signal generating portion 70 generates a voltage signal having a 50 kHz square wave. More specifically, the 50 kHz constant-voltage square wave is output from a port using a timer function of microcontroller 140. In this embodiment, alternating voltage signal generating portion 70 is embedded in microcontroller 140, meanwhile the signal may be generated outside microcontroller 140 as a matter of course.

Filter 3 may be composed of a low-pass or band-pass filter which passes 50 kHz and removes a harmonic component of the 50 kHz voltage signal. As a result, the signal that has been passed through filter 3 is a sine wave.

Voltage-to-current converting portion 4 converts the voltage signal output from filter 3 to current signal. The current signal is supplied in series to reference impedance $Z_r$ and biological impedance $Z_h$ which are serially connected. Reference impedance $Z_r$ is known and biological impedance $Z_h$ is impedance of the human subject.

Body measurement apparatus 100 includes two current electrodes (CE) 5A, 5B and two voltage electrodes (VE) 6A, 6B. As illustrated in FIG. 4, current electrode 5A is placed corresponding to an anterior portion of a left foot, electrode 6A is placed corresponding to a heel portion of the left foot, electrode 5B is placed corresponding to an anterior portion of a right foot, and electrode 6B is placed corresponding to a heel portion of the right foot.

Signal selecting portion 7 selects terminals T1 and T2 located on both ends of reference impedance $Z_r$ or voltage electrodes 6A and 6B for measuring biological impedance $Z_h$. Signal receiving portion 8 may be composed of a differential amplifier. The differential amplifier acts as a voltage buffer amplifier with high impedance input. As a result, when terminals T1 and T2 located on both ends of reference impedance $Z_r$ are selected by signal selecting portion 7, signal receiving portion 8 outputs voltage $V_r$ of reference impedance $Z_r$. Meanwhile, when voltage electrodes 6A and 6B are selected by signal selecting portion 7, signal receiving portion 8 outputs voltage $V_h$ of biological impedance $Z_h$. Signal receiving portion 8 adjusts signal amplitude according to a dynamic range of shift signal adding portion 30 or AD converting portion 40.

An alternating voltage outputted from signal receiving portion 8 is added with direct-current shift signals $\delta_k$ (described below) and is input to AD converting portion 40. Shift signal generating portion 20 is controlled by shift signal controlling portion 10 and outputs 27 DC voltages as shift signals $\delta_k$ to shift signal adding portion 30. Intervals of 27 DC voltages are equivalent. Although shift signal generating portion 20 may be composed of a dedicated DA converter, in this embodiment, shift signal generating portion 20 is composed of three ports of microcontroller 140 being controllable with three-state form, a plurality of resistances, and a buffer. Since each of the three ports can take three states, each of which is a high level state, a low level state, or a high impedance state, the three ports can represent 27 states. As a result, 27 DC voltages can be generated as shift signals $\delta_k$.

Shift signal controller 10 controls the states of the three ports of microcontroller 140. Shift signal adding portion 30 sets a one-fold gain for the voltage inputted from signal receiving portion 8 and sets gains such that each of 27 shift signals $\delta_k$ differs by ⅑ LSB from the adjacent shift signals $\delta_k$ for DC voltages generated in shift signal generating portion 20.

AD converting portion 40 divides a 50 kHz sine wave into 20 parts per cycle and measures at the 20 phase points. Signal processing portion 50 obtains voltages at the phase points of the alternating voltage with higher resolution than the original resolution of AD converting portion 40 using the results of the AD conversion.

Impedance calculating portion 60 calculates impedance using the high resolution AD conversion results obtained by signal processing portion 50.

Specifically, vector components (a resistance component and a reactance component) are obtained by executing synchronous detection using the high resolution AD conversion results at the 20 phase points. The synchronous detection is executed for both reference impedance $Z_r$ and biological impedance $Z_h$. Biological impedance $Z_h$ is obtained by executing complex arithmetic represented as a following formula in accordance with a voltage comparison method:

$$Z_h = Z_r \cdot V_h / V_r$$

As described above, biological impedance $Z_h$ is calculated.

Operations of Body Measurement Apparatus

Figure 5:
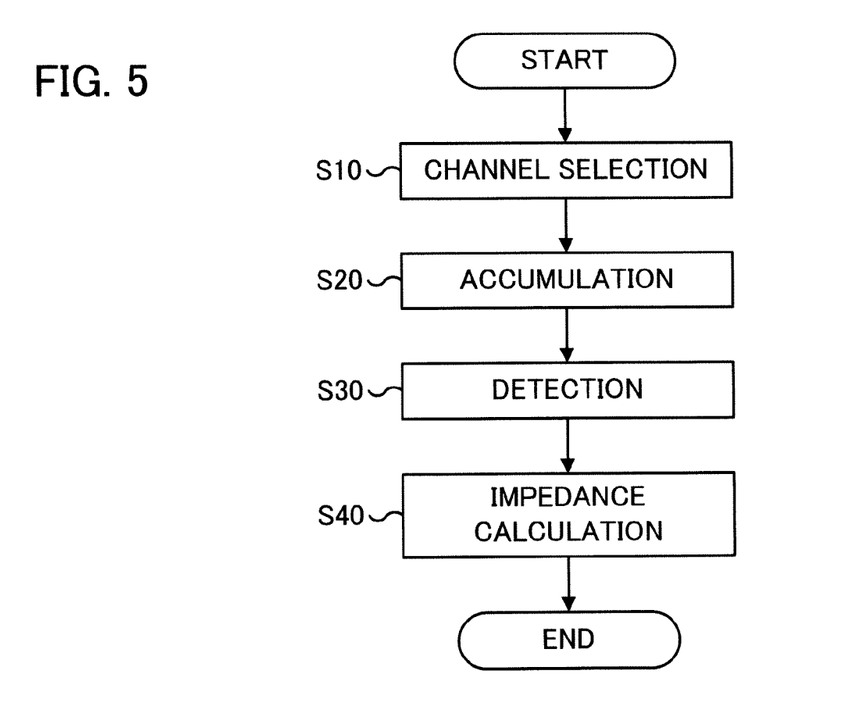
FIG. 5 is a flow chart which shows operations of the body measurement apparatus.

Operations generating biological impedance in body measurement apparatus 100 will be explained with reference to FIG. 5.

Firstly, microcontroller 140 controls signal selecting portion 7 to select reference impedance $Z_r$ or biological impedance $Z_h$ (step S10).

Next, microcontroller 140 executes an accumulation process (step S20). In the accumulation process, microcontroller 140 sequentially adds 27 shift signals $\delta_k$ to voltage $V_r$ or voltage $V_h$ to generate 27 first signals S1, executes AD conversion to convert the signals into 27 second signals S2, and average 27 second signals S2. As a result, voltage $V_r$ and voltage $V_h$ can be AD-converted with a resolution which exceeds the minimum resolution of AD converting portion 40.

AD conversion operations will be explained specifically. Given that a output signal from signal receiving portion 8 is $V_{sig}$ and DC voltages outputted from shift signal generating portion 20 are $\Delta_k$ (k=0, ..., 26), AD conversion results $C_k$ are represented as follows:

$$C_k = \text{Round}[A(V_{sig} + \Delta_k)] \ (k=0, 1, \ldots, 26)$$

An 'A' is a constant for converting a voltage into an AD conversion result code used in AD converting portion 40 and a 'Round' is a function rounding a value outputted from AD converting portion 40 less than 1 LSB.

Given that $C_{sig}$ is equal to $A \cdot V_{sig}$ and $\delta_k$ is equal to $A \cdot \Delta_k$, the above formula is represented as follows:

$$C_k = \text{Round}[C_{sig} + \delta_k] \ (k=0, 1, \ldots, 26)$$

Final AD conversion result CT is an average value of AD conversion results $C_k$ corresponding to 27 DC voltages and is represented as follows:

$$CT = 1/n \times \Sigma[\text{Round}(C_{sig} + \delta_k)] \ (k=0, 1, \ldots, 26, n=27)$$

This calculation is executed in signal processing portion 50. Conventionally an output signal from signal receiving portion 8 is often rounded and a fraction is disregarded. In this embodiment, an AD conversion result with a higher resolution than the original resolution of AD converting portion 40 can be obtained by averaging using plural shift signals $\delta_k$ with ⅑-LSB steps.

For reducing an amount of calculation, following cumulative value CT' may be used.

$$CT' = \Sigma[\text{Round}(C_{sig} + \delta_k)] \ (k=0, 1, \ldots, 26)$$

The AD conversion results are accumulated for four times to obtain a stable result. As described above, output digital signals are generated.

Figure 6:
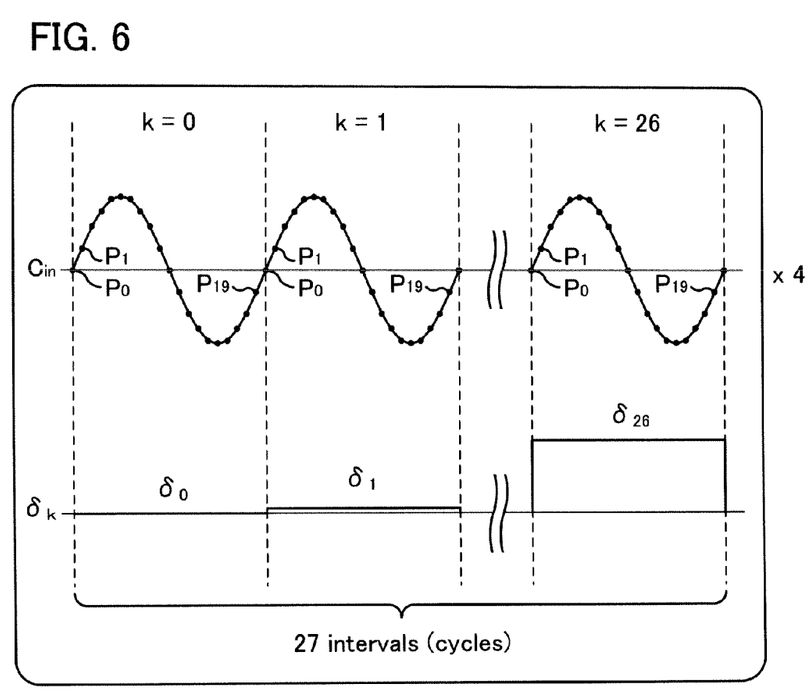
FIG. 6 shows an outline of an AD conversion operation.

With reference to FIG. 6, it will be explained of a relationship among sine-wave input analog signal $C_{in}$ which is supplied to shift signal adding portion 30, shift signals $\delta_k$, and 20 phase points per one cycle in AD converting portion 40.

To generate 27 DC voltages as shift signals $\delta_k$, shift signal controlling portion 10 controls shift signal generating portion 20 to switch 27 shift signals $\delta_0, \delta_1, \ldots,$ and $\delta_{26}$ sequentially every interval of the cycle of input analog signal $C_{in}$.

AD converting portion 40 executes AD conversion on 20 phase points $P_0, P_1, \ldots,$ and $P_{19}$ per one cycle. AD converting portion 40 executes AD conversion to convert 27 first signals S1 obtained by adding each of 27 shift signals $\delta_k$ to input analog signal $C_{in}$ on each phase point into 27 second signals S2 and signal processing portion 50 calculates an average of 27 second signals S2. As a result, input analog signal $C_{in}$ is converted to output digital signal $C_{out}$. In this case, 27 cycles of input analog signal $C_{in}$ are necessary to obtain one-cycle output digital signal $C_{out}$. In this embodiment, this process is repeated four times so as to obtain precision output digital signal $C_{out}$.

When input analog signal $C_{in}$ is an alternating-current signal which repeats at a constant interval, AD converting portion 40 executes AD conversion in synchronization with the alternating-current signal and shift signal controlling portion 10 controls shift signal generating portion 20 so as to switch n shift signals $\delta_k$ every interval of the alternating-current signal. Signal processing portion 50 processes n second signals S2 in each same phase of each interval of the alternating-current signal into output digital signal $C_{out}$.

Again, this will be explained with reference to FIG. 5. After step S20, microcontroller 140 executes detection process (step S30). Specifically, vector components (a resistance component and a reactance component) are obtained by executing synchronous detection between output digital signal $C_{out}$ and a 50 kHz current signal. Microcontroller 140 executes impedance calculation to calculate biological impedance $Z_h$ in accordance with the above-described voltage comparison method (step S40).

Figure 7:
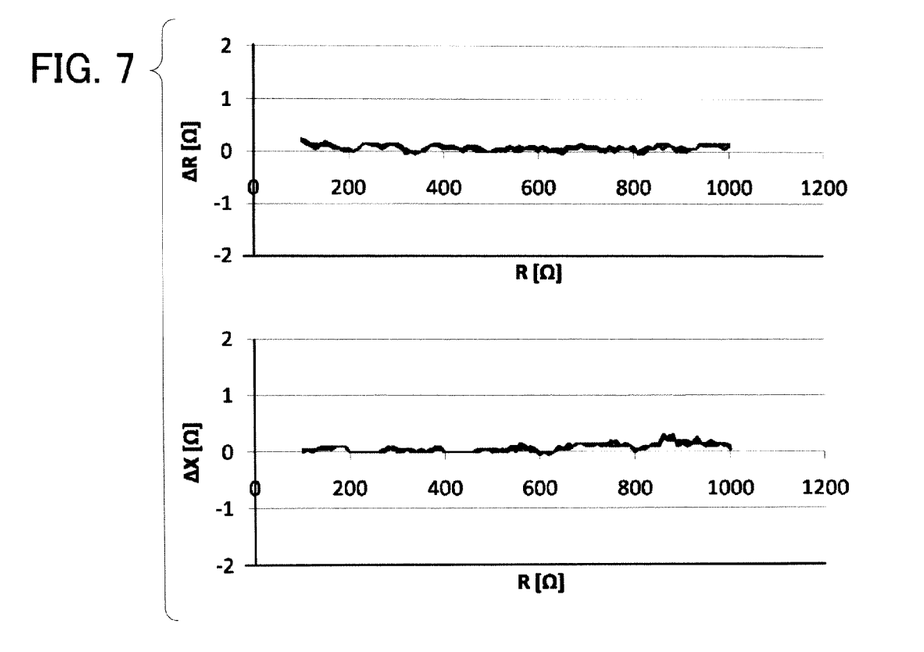
FIG. 7 is a graph which shows errors of resistance components and reactance components measured by the body measurement apparatus.
Figure 8:
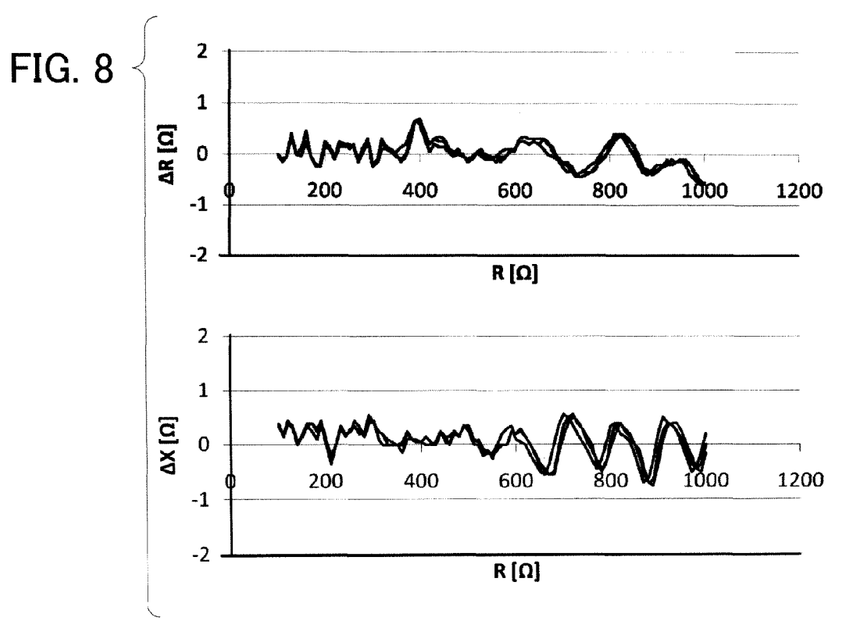
FIG. 8 is a graph which shows errors of resistances component and reactance components without addition of shift signals.

FIG. 7 shows errors of resistance components and reactance components measured by body measurement apparatus 100 of this embodiment. FIG. 8 shows errors of resistance components and reactance components without addition of shift signals $\delta_k$ as a comparative example. As these figures show, the errors can be greatly reduced according to this embodiment. Particularly, it is effective for a general microcontroller in which the AD converting portion 40 is embedded. When such microcontroller is used, the resolution of AD conversion can be greatly improved by adding a minute component.

Other Variations and Modifications

The present invention is not limited to the above-described embodiments. For example, the following modifications are possible.

(1) In the above-described second embodiment, input analog signal $C_{in}$ is the alternating-current signal which repeats at the constant interval. When 27 shift signals $\delta_k$ are generated, switching of shift signals $\delta_k$ are executed in 27 cycles (intervals) by switching shift signals $\delta_k$ every interval of the cycle of input analog signal $C_{in}$. To enhance accuracy, one-cycle output digital signal $C_{out}$ may be obtained by repeating the 27-cycle set for four times and averaging the repeated results.

In the above-described embodiment, it is required to switch shift signals $\delta_k$ for 4×27 times as a whole. Since it takes time to switch shift signals $\delta_k$, it is preferable that the number of switchings be as small as possible. Owing to a floating capacitance and a wiring resistance, a transmission channel from shift signal generating portion 20 to shift signal adding portion 30 is equivalent to a low-pass filter. As a result, it takes time to reflect an effect of switching shift signals $\delta_k$ in an addition result with accuracy.

Figure 9:
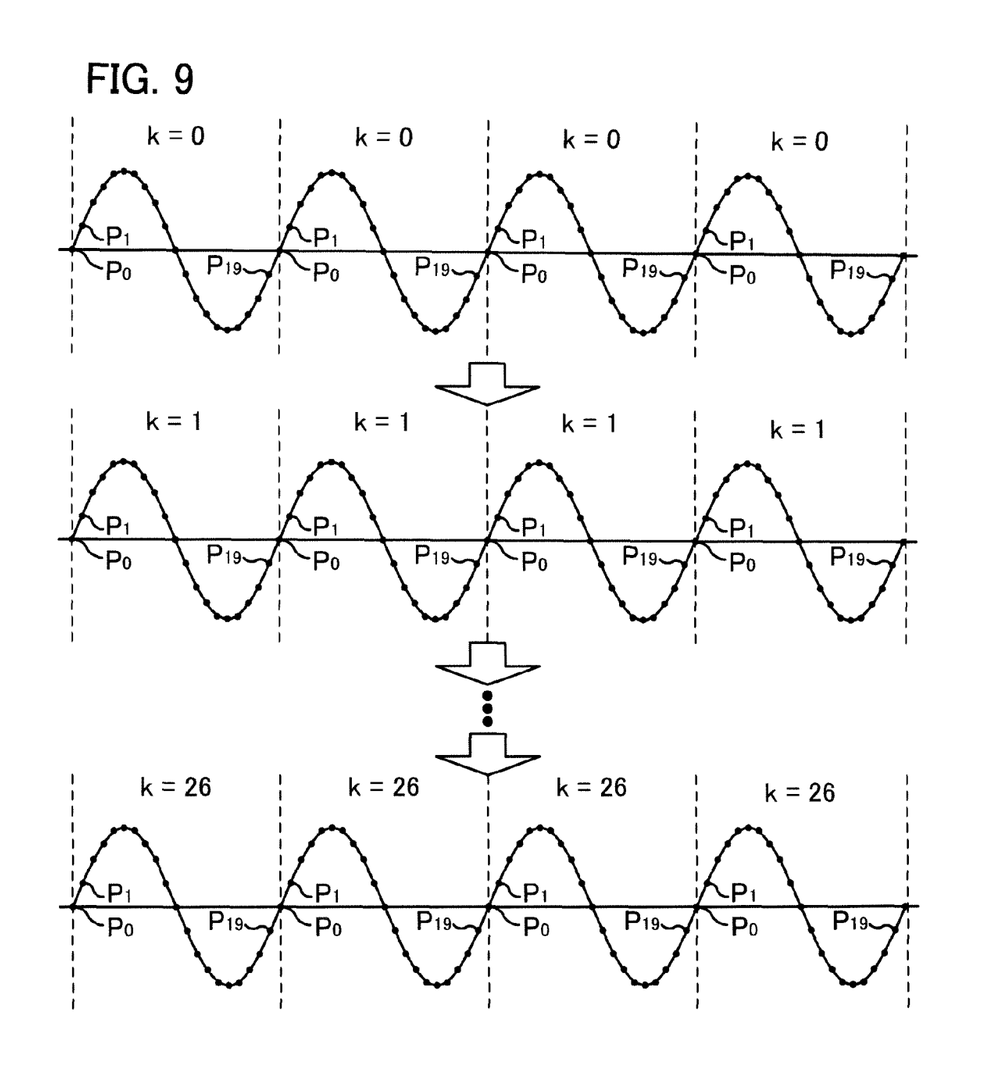
FIG. 9 shows an outline of an AD conversion operation according to a modification.

In view of the above conditions, shift signals $\delta_k$ may be switched as shown in FIG. 9. That is, it is assumed that input analog signal $C_{in}$ is an alternating-current signal which repeats at a constant interval and output digital signal $C_{out}$ is generated based on n·p intervals (p is a natural number greater than one) of the cycle of the alternating-current signal. In the example shown in FIG. 9, n=27 and p=4. AD converting portion 40 may execute AD conversion in synchronization with the alternating-current signal. Shift signal controlling portion 10 may control shift signal generating portion 20 to switch 27 shift signals $\delta_k$ every four intervals of the alternating-current signal. Signal processing portion 50 may process 27×4 second signals S2 in each same phase points $P_0, P_1, \ldots,$ and $P_{19}$ of the alternating-current signal into output digital signal $C_{out}$. As a result, the number of switching shift signals k can be reduced to 27 times.

(2) In the above-described embodiments, shift signal adding portion 30 generates first signals S1 by adding each of shift signals $\delta_k$ to input analog signal $C_{in}$. On the other hand, first signals S1 may be generated by subtracting each of shift signals $\delta_k$ from input analog signal $C_{in}$. In summary, first signals S1 may be generated by compounding input analog signal $C_{in}$ and shift signals $\delta_k$.

(3) In the above-described embodiments, the amplitudes of n shift signals $\delta_k$ are different from each other and n shift signals k are selected so that the differences between the adjacent shift signals are equal to each other and that the differences are less than the minimum resolution when n shift signals $\delta_k$ are arranged according to the amplitudes. On the other hand, parts of n shift signals $\delta_k$ may correspond to natural number multiples of the minimum resolution (1 LSB).

The minimum value of n shift signals $\delta_k$ may exceed the minimum resolution (1 LSB). For example, n shift signals $\delta_k$ may be set equivalent, that is, $\Delta=\delta_k-\delta_{k-1}$, and $\delta_0=1.1$ LSB, $\delta_1=1.3$ LSB, $\delta_2=1.5$ LSB, $\delta_3=1.7$ LSB, $\delta_4=1.9$ LSB, and $\delta_5=2.1$ LSB given that $\Delta=0.2$ LSB and n=5. In comparison in the case in which n shift signals $\delta_k$ are set such that $\delta_0=0.1$ LSB, $\delta_1=0.3$ LSB, $\delta_2=0.5$ LSB, $\delta_3=0.7$ LSB, $\delta_4=0.9$ LSB, and $\delta_5=1.1$ LSB, the minimum shift signal $\delta_0$ can take a greater value. In general, it is difficult to generate a minute voltage precisely due to noise. The minute voltage can be generated easily by setting such that the minimum value of n shift signals $\delta_k$ exceeds the minimum resolution (1 LSB).

When the difference between the minimum value ($\delta_0=1.1$ LSB) and the maximum value ($\delta_5=2.1$ LSB) of n shift signals $\delta_k$ is equal to or more than the minimum resolution of AD converting portion 40 as this example, at least one second signal S2 differs from the other second signals S2 by adding each of n shift signals $\delta_k$ to input analog signal $C_{in}$ with any amplitude. As a result, the resolution of AD conversion can be improved.

What is claimed is:

1. An AD conversion apparatus comprising:
   a shift signal generating portion configured to generate n shift signals (n is a natural number greater than one) of which amplitudes are different from each other;
   a compounding portion configured to compound input analog signal and the n shift signals sequentially into n first signals;
   an AD converting portion configured to execute AD conversion to convert the n first signals into n second signals; and
   a signal processing portion configured to process the n second signals into output digital signal,
   wherein the shift signal generating portion is configured to generate the n shift signals so that each difference between adjacent shift signals differs from natural number multiples of a minimum resolution of the AD converting portion when the n shift signals are arranged according to the amplitudes.

2. The AD conversion apparatus according to claim 1, wherein the shift signal generating portion is configured to generate the n shift signals so that the differences between the adjacent shift signals are equal to each other and so that the differences are less than the minimum resolution when the n shift signals are arranged according to the amplitudes.

3. The AD conversion apparatus according to claim 2, wherein the shift signal generating portion is configured to generate the n shift signals so that a difference between a minimum value and a maximum value of the n shift signals is equal to or greater than the minimum resolution of the AD converting portion.

4. The AD conversion apparatus according to claim 1, wherein the signal processing portion is configured to calculate an average of the n second signals to generate the output digital signals.

5. The AD conversion apparatus according to claim 1, wherein the input analog signal is an alternating-current signal, which repeats at a constant interval,
   one cycle of the alternating-current signal corresponding to the interval,
   the AD converting portion executing AD conversion in synchronization with the alternating-current signal,
   the AD conversion apparatus further comprising a shift signal controlling portion configured to control the shift signal generating portion so as to switch
   the n shift signals every interval of the alternating-current signal, and
   the signal processing portion processing the n second signals in same phase of each interval of the alternating-current signal into the output digital signal.

6. The AD conversion apparatus according to claim 1, wherein
   the input analog signal is an alternating-current signal that repeats at a constant interval,
   one cycle of the alternating-current signal corresponding to the interval,
   the AD conversion apparatus being configured to generate the output digital signal based on the np intervals (p is a natural number greater than one) of the alternating-current signal,
   the AD converting portion executing AD conversion in synchronization with the alternating-current signal,
   the AD conversion apparatus further comprising a shift signal controlling portion configured to control the shift signal generating portion so as to switch the n shift signals every p intervals of the alternating-current signal, and
   the signal processing portion processing the np second signals in same phase of each interval of the alternating-current signal into the output digital signal.

7. An electronic device comprises the Ad conversion apparatus according to claim 1.

8. An AD conversion method comprising:
   generating n shift signals (n is a natural number greater than one) of which amplitudes are different from each other;
   compounding input analog signal and the n shift signals sequentially into n first signals;
   executing AD conversion to convert the n first signals into n second signals; and
   processing the n second signals into output digital signal,
   wherein each difference between adjacent shift signals differs from natural number multiples of a minimum resolution of the AD conversion when the n shift signals are arranged according to the amplitudes.

* * * * *